United States Patent [19]

Thomas

[11] Patent Number: 5,783,363
[45] Date of Patent: Jul. 21, 1998

[54] METHOD OF PERFORMING CHARGED-PARTICLE LITHOGRAPHY

[75] Inventor: Michael E. Thomas, Milpitas, Calif.

[73] Assignee: National Semiconductor Corporation, Santa Clara, Calif.

[21] Appl. No.: 786,196

[22] Filed: Jan. 21, 1997

Related U.S. Application Data

[63] Continuation of Ser. No. 878,556, May 28, 1992, abandoned.

[51] Int. Cl.[6] .................................................. G03F 7/00
[52] U.S. Cl. .......................... 430/296; 430/327; 430/942
[58] Field of Search .................................. 430/296, 942, 430/324, 327, 315, 323, 313, 314, 316, 317

[56] References Cited

U.S. PATENT DOCUMENTS

| | | | |
|---|---|---|---|
| 4,338,392 | 7/1982 | Engler et al. | 430/942 |
| 4,595,649 | 6/1986 | Ferguson et al. | 430/942 |
| 4,770,940 | 9/1988 | Ovshinsky et al. | 428/408 |
| 4,810,617 | 3/1989 | White et al. | 430/942 |
| 5,041,358 | 8/1991 | Hatzakis et al. | 430/323 |
| 5,091,285 | 2/1992 | Watanabe et al. | 430/296 |
| 5,139,922 | 8/1992 | Watanabe et al. | 430/942 |
| 5,169,494 | 12/1992 | Hashimoto et al. | 430/313 |
| 5,198,266 | 3/1993 | Witucki et al. | 427/387 |
| 5,198,326 | 3/1993 | Hashimoto et al. | 430/942 |

FOREIGN PATENT DOCUMENTS

| | | | |
|---|---|---|---|
| 0181428 | 7/1988 | Japan | 430/942 |
| 0101461 | 4/1990 | Japan | 430/942 |

OTHER PUBLICATIONS

Kanatzidis, Conductive Polymers, Chemical & Engineering News, Dec. 3, 1990, pp. 36–54.

*Primary Examiner*—Rachel Gorr
*Attorney, Agent, or Firm*—Limbach & Limbach, L.L.P.

[57] ABSTRACT

An improvement in a method of charged-particle lithography includes the step of spinning an electrically-conductive layer on a substrate. In one embodiment, an electrically-conductive transfer layer is applied on a substrate. In another embodiment, an electrically-conductive planarizing layer is applied on a substrate. In another embodiment, an electrically-conductive imageable layer is applied on a substrate. In another embodiment, a separate electrically-conductive layer is applied. In another embodiment, a planarizing layer, a transfer layer, or an imageable layer is bombarded with ions to form a thin electrically-conductive carbonized layer.

3 Claims, 15 Drawing Sheets

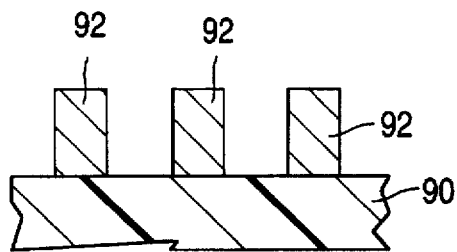
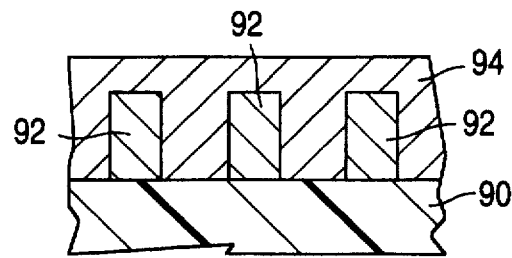
FIG. 39  FIG. 40
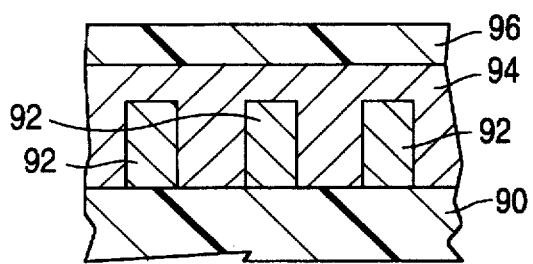
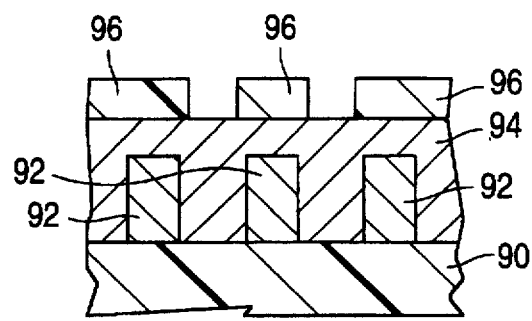
FIG. 41  FIG. 42
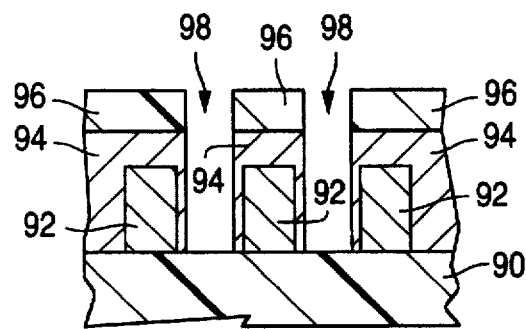
FIG. 43

METHOD OF PERFORMING CHARGED-PARTICLE LITHOGRAPHY

This is a continuation of application Ser. No. 07/878,556 file on May 28, 1992, now abandoned.

BACKGROUND OF THE INVENTION.

This invention relates to the manufacture of semiconductor devices and in particular to the formation of structures in semiconductor devices by lithography, particularly electron-beam and ion-beam lithography.

In the manufacture of semiconductor devices, lithographic techniques are employed to provide patterns in a substrate. According to lithographic techniques, a resist layer or film is formed on a substrate. A beam of light or particles then impinges on and exposes selected portions of the resist layer. In the selected portions of the photoresist layer on which the beam impinges, the film undergoes chemical changes involving either chain scission or cross linking which makes it more or less soluble in an etchant called a developer. After exposure of the resist to the developer either the changed or the unchanged portions of the resist layer are removed, leaving a desired pattern which is used for further processing.

In electron-beam lithography, a beam of electrons impinges on a resist which typically possesses insulating properties. As a result of this property, electrons accumulate on the surface and generate a local surface charge. This accumulation of electric charge results in formation of electrostatic fields, which deflect incoming electrons and cause a deviation in the local resist exposure which is detrimental to pattern formation. Due to this effect, the desired degree of accuracy in exposure and resulting feature definition is not achieved. The same problem is encountered in connection with ion beam lithography since charged particles are used in this process.

This problem may become especially acute when trilevel resist processes are used. A trilevel resist process is used when fine line resist patterns are desired having large aspect ratios. The first layer in the trilevel resist is a thick resist layer which does not require photographic properties. This thick resist layer fills in spaces between and completely covers the structures. This layer is called by convention a planarizing layer. The second layer in the trilevel resist is an intermediate layer, called a transfer layer, which is typically an etch resistant layer such as a spin-on-glass, which is formed on the planarizing layer. The third layer is a thin resist layer formed on the transfer layer. The thin resist layer is imageable, i.e., it is composed of a substance that undergoes chemical change when exposed to a flux of electrons. In electron-beam lithography, a thin imageable layer, or resist, is advantageous since scattering of electrons is minimized due to the thinness of the film. Any image formed in the imageable layer must be transferable to the planarizing layer. As most existing resists are not etch-resistant in a reactive ion etch, for example, oxygen, the transfer layer is applied on the planarizing layer before the resist is applied.

Present solutions to this problem involve physical vapor deposition of a conductive layer between the planarizing and thin resist layers. For example, a conductive layer of titanium may be formed by physical vapor deposition. However, the deposition process must take place in a vacuum chamber, and is fairly costly and slow. The equipment required for physical vapor deposition is quite expensive. The process of physical vapor deposition cannot be easily achieved during the in-line processing of wafers. The wafers must be moved between different pieces of equipment where thick resists and the like, which are applied in a spinning process, are provided, and removed to specialized equipment, conventionally a sputtering machine, for physical vapor deposition and other processes. The reason for this is that physical vapor deposition is not readily achieved under atmospheric conditions. As a result, processing of wafers is considerably slowed by, and made more expensive by, deposition of a metal layer. Outgassing of compounds in the planarizing layer of the wafer can occur during vacuum processing and cause contamination of the vacuum chamber and transfer layer.

Objects and advantages of this invention will be apparent from the detailed description of a preferred embodiment which follows.

SUMMARY OF THE INVENTION.

In a process for performing charged-particle lithography, an improvement comprises the step of spinning on an electrically-conductive layer.

In a process for performing charged-particle lithography, an improvement comprises the step of forming a carborized layer on a substrate.

BRIEF DESCRIPTION OF THE FIGURES.

FIG. 39 is a sectional view of the surface of a wafer prior to the first step according to an alternative embodiment of the invention.

FIG. 40 is a sectional view, similar to FIG. 39, after the step of forming of a planarizing layer.

FIG. 41 is a sectional view, similar to FIG. 40, after the step of forming of an imageable layer.

FIG. 42 is a sectional view, similar to FIG. 41, after the step of developing of the imageable layer.

FIG. 43 is a sectional view, similar to FIG. 42, after the step of etching of the planarizing layer.

DETAILED DESCRIPTION OF A PREFERRED EMBODIMENT.

Figure 1:
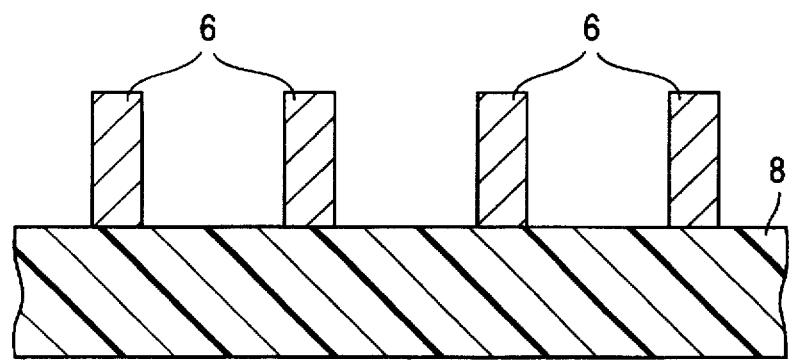
FIG. 1 is a sectional view of a portion of the surface of a partially-processed semiconductor wafer prior to the first step of the process of the invention.

With reference to FIGS. 1 to 8, there will be explained an embodiment of the invention where a liquid is applied and processed to form a solid conductive transfer layer. Referring to FIG. 1, there is shown a structure prior to the first step of the process of the invention. A semiconductor wafer 8 has structures 6 built thereon. Structures 6 are intended to be merely representative of the types of structures that may be present on a wafer.

Figure 2:
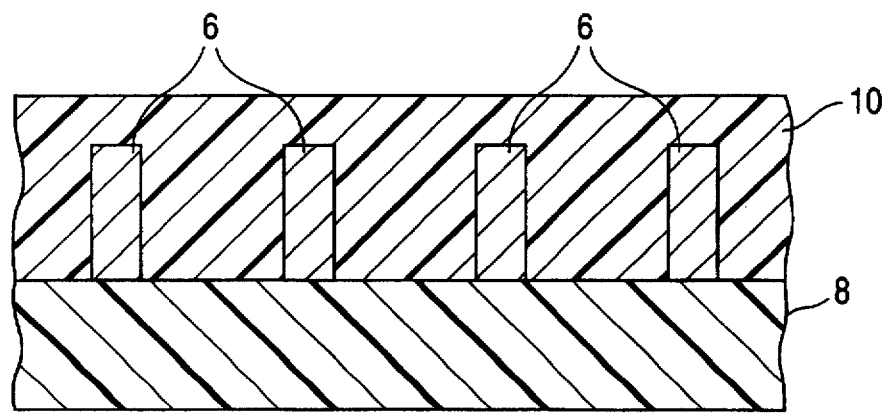
FIG. 2 is a sectional view, similar to FIG. 1, after the step of forming a thick resist layer.

Referring to FIG. 2, a thick layer 10 is applied on the wafer 8. The layer 10 is a thick resist. A thick resist 10 may be made of a resin which is insensitive to exposure by electrons or photons, such as novalak. The step of applying the thick resist is as follows. A liquid is applied on a substrate. The liquid is spun over the wafer. The liquid may be a novalak resin in a solvent consisting primarily of ethyl cellusolve, having a viscosity in the range of 1 to 10 centipoise. The novalak resin in a solvent is applied in droplet form with the wafer in a static or rotating state at the time the novalak resin solution is applied. After application of the novalak solution, the wafer is spun at an acceleration of 5,000 to 20,000 revolutions per minute per second. After acceleration, the rotational speed of that wafer is held between 2,000 and 6,000 revolutions per minute. The spin conditions and fluid viscosity determine the final thickness of layer 10.

The thick layer 10 is substantially dried of retained solvent by baking it at a temperature of 90 degrees Celsius for one minute. The resulting thick layer 10 typically has a thickness which can be adjusted between 5,000 and 25,000 Angstroms. The result of this step is shown in FIG. 2. Thick layer 10, on substrate 8, covers the structures 6.

Figure 3:
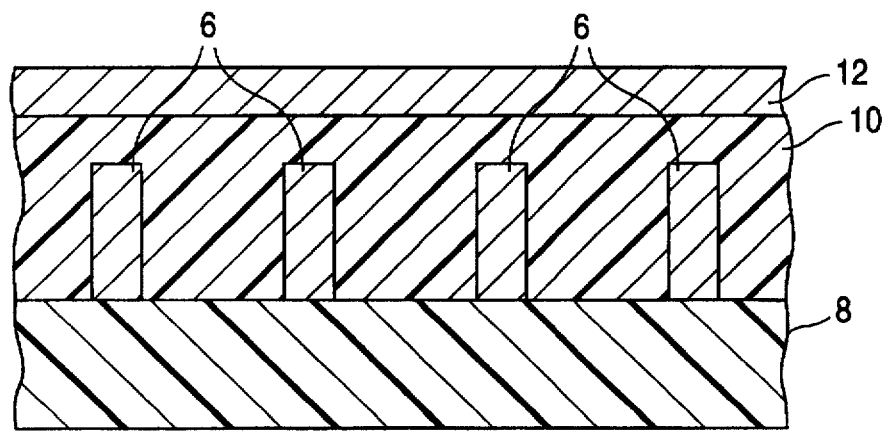
FIG. 3 is a sectional view, similar to FIG. 2, after the step of forming a conductive transfer layer.

After the step of forming a thick planarizing resist layer, the step of spinning on an electrically-conductive layer is performed. This step includes applying a liquid that forms a transfer layer. Referring to FIG. 3, a liquid is applied that will yield an electrically-conductive substance 12 on the substrate. The liquid may include primarily an organosilicon compound. The liquid may be an organosilicon compound possessing its own conductive properties or containing a soluble electrically-conductive substance. The organosilicon compound may be a silicone. The organosilicon compound may also be a silicate. The conductive substance may be a metal soap. The metal soap may be a metal oleate. For example, the metal oleate may be zirconium oleate, zinc oleate, titanium oleate or cobalt oleate. A range of percentage of the liquid by weight that is composed of a metal soap is one to two percent. Excellent results have been obtained using a concentration of two percent of metal soap by weight in the liquid.

The liquid may be applied by spinning as follows. The wafer is either spinning or stationary at the time the liquid is applied. The liquid is applied in drops. The wafer is spun at an acceleration of from 5,000 to 20,000 revolutions per minute per second. The maximum rate of spinning is ramped from 2,000 to 6,000 revolutions per minute.

Mixing of the organosilicon compound with the metal soap should desirably be done only shortly before the spinning of the liquid onto the thick layer 10. This is because the metal soap will tend to cure the silicone.

This step of applying may be accomplished at atmospheric pressure and at room temperature. Accordingly, the wafer need not be moved to a vacuum chamber, as was required with deposition of a metal layer. Also, the liquid may be spun on using the same spin chuck as is used for application of resist. Thus, the wafer need not be moved. This speeds up processing and reduces its cost.

The liquid is then allowed to cure. The step of curing may take place either at room temperature or at accelerated bake temperatures typically of 110° Celsius. When curing is complete, the dried film that remains is an electrically-conductive transfer layer, or conductive film 12, formed on the thick resist 10, as shown in FIG. 3. The thickness of the conductive transfer layer 12 is desirably in a range from 500 angstroms to 5000 angstroms.

By electrically conductive, it is meant that the substance is capable of moving charge rapidly away from a local area during charged particle exposure. Actual maximum resistivity will depend on the particular application.

Figure 4:
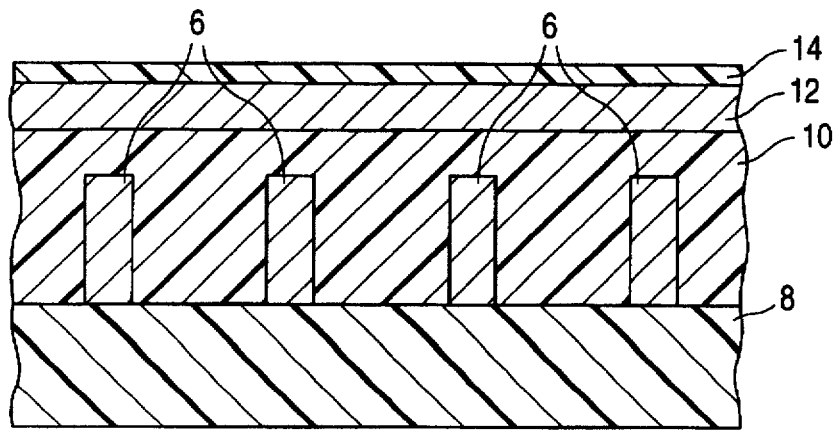
FIG. 4 is a sectional view, similar to FIG. 3, after the step of forming an active resist layer.

After the conductive transfer layer has been allowed to cure, an active resist layer is formed on the conductive transfer layer. The active resist layer is composed of a substance that undergoes chemical change when exposed to a flux of electrons or ions. The active resist layer is formed by conventional techniques well known in the art. The resulting structure, with active resist layer 14 on conductive transfer layer 12, is shown in FIG. 4.

The active resist layer is then exposed. It is contemplated that exposure will be performed by electron-beam writing or ion-beam exposure. The step of electron-beam writing or ion-beam exposure is performed in accordance with conventional techniques known in the art. Electrical charge will tend to accumulate in the resist during exposure. Electrical charge is transferred from the resist layer 14 to the conductive transfer layer 12. Because the conductive transfer layer 12 is conductive, electrical charge will not build up on any one area of the conductive transfer layer. Electrostatic fields will not build up in the resist. As a result, the electron or ion beam will not be deflected by electrostatic fields.

Figure 5:
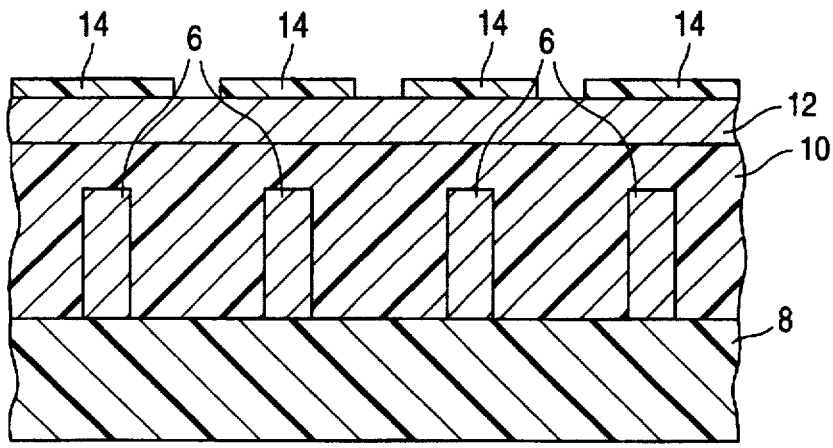
FIG. 5 is a sectional view, similar to FIG. 4, after the step of exposure of the active resist layer.

After exposure, the active resist layer is then developed. The step of development of the active resist layer is performed by conventional techniques known in the art. Only a selected portion of the active resist layer remains after the step of development. The structure after this step is shown in FIG. 5. Active resist layer 14 shown in FIG. 5 is divided into a number of selected portions.

Figure 6:
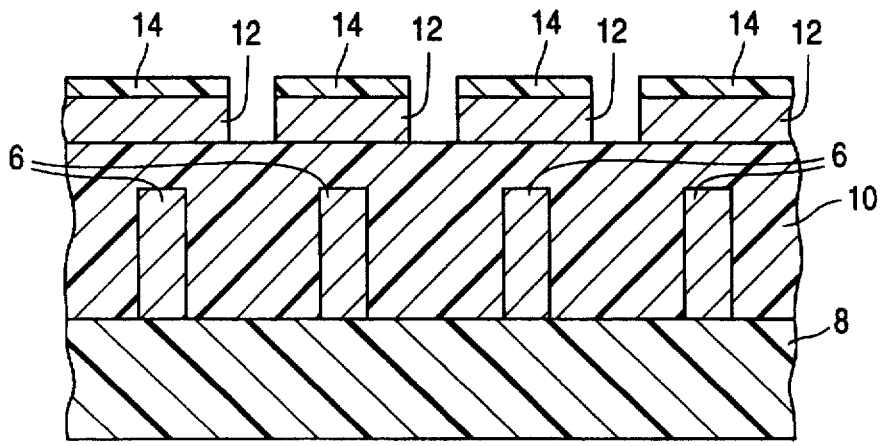
FIG. 6 is a sectional view, similar to FIG. 5, after the step of etching the conductive transfer layer.
Figure 7:
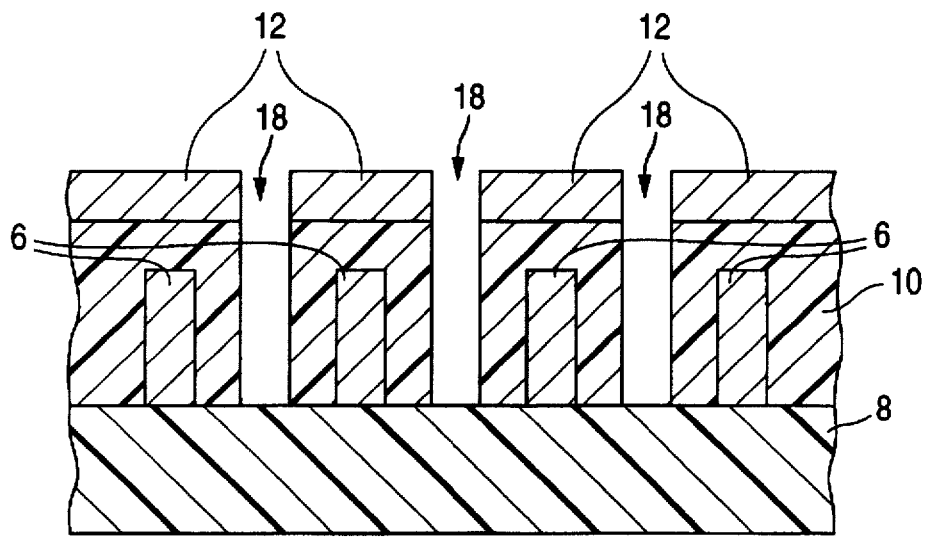
FIG. 7 is a sectional view, similar to FIG. 6, after the step of etching the thick layer.
Figure 8:
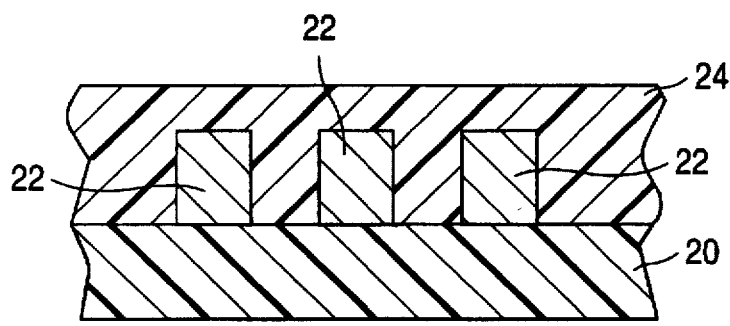
FIG. 8 is a sectional view of a portion of the surface of a partially-processed semiconductor wafer after the first step of a process according to an alternative embodiment of the invention.

The conductive transfer layer is then etched. An etch is used such that the active resist is not substantially attacked during the removal and definition of the conductive transfer layer. The etch may be, for example, 75 sccm:15 sccm CHF3/O$_2$ at 60 milliTorr. The structure after this step is shown in FIG. 6. In FIG. 6, only the portion of conductive transfer layer 12 that is beneath the portions of the active resist 14 remains.

The thick layer 10 is then etched or patterned. If layer 14 is etched by the same plasma as the planarization layer 10, then the remaining portions of the layer 14 may be removed, if desired, before, after, or during the etching of the planarization layer. As may be seen in FIG. 7, the step of etching the thick layer 10 provides deep channels or holes 18 through thick layer 10 to structure 6. If thick layer 10 is novalak resin, it may be etched by use of an oxygen plasma in accordance with techniques well-known in the art. The conductive transfer layer must be resistant to the etch. An example of a material that is resistant to an oxygen-plasma etch is polymethyl siloxane. The use of a bifunctional conductive transfer layer that both carries charge away and also serves as a transfer mask for etching the thick resist layer is advantageous.

The thick resist 10 is then used for various processes such as etching or ion implantation.

An additional method according to the invention will now be explained with reference to FIGS. 8 through 13. In this embodiment, the step of spinning on an electrically-conductive layer includes spinning on an electrically-conductive transfer layer, specifically, a conductive spin-on-glass layer. According to FIG. 8, there is shown a structure on a substrate or wafer 20, with features 22 being representative of features providing an uneven topography. Planarizing layer 24 covers the features 22. Planarizing layer 24 is a conventional planarizing layer having insulating properties. For example, the planarizing layer 24 may be made of a resin such as novalak, which is insensitive to exposure by electrons or photons. The planarizing layer is formed by spinning a liquid, such as a novalak resin in a solvent consisting primarily of ethyl cellusolve, having a viscosity in the range of 1 to 10 centipoise. The liquid is applied in droplet form with the wafer in a static or rotating state at the time the liquid is applied. After application of the liquid, the wafer is spun at an acceleration of 5000 to 20000 revolutions per minute per second. The maximum rate of spinning can be varied from 2000 to 6000 revolutions per minute. The spin conditions and fluid viscosity determine the final thickness of layer 24. The planarizing layer 24 is substantially dried of retained solvent by baking it at a temperature of 90 degrees Celsius for one minute. The resulting planarizing layer 24 typically has a thickness which can be adjusted between 5000 and 25000 Angstroms.

Figure 9:
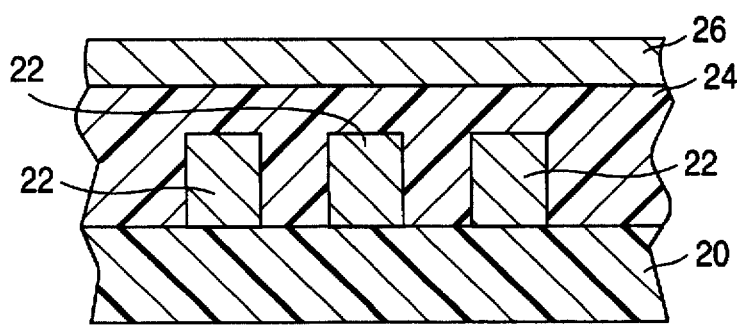
FIG. 9 is a sectional view, similar to FIG. 8, after a step of forming a transfer layer.

After application of the planarizing layer 24, the step of applying an electrically-conductive layer, namely a transfer layer 26, referring to FIG. 9, is performed. The transfer layer 26 is an electrically-conductive transfer layer made of an electrically-conductive spin-on-glass. The conductive spin-on-glass is a doped siloxane resin. The dopant provides conductivity. Any metal ion may be used as a dopant. The glass is provided by conventional techniques for spinning a glass layer. The glass is formed by applying a liquid made up of the conductive spin-on-glass in a solvent. After application of the liquid, the wafer is baked, leaving a planarized glass film. The steps of spinning and baking are performed substantially as above in the application of the organic compound layers. The result of the step of applying the conductive spin-on-glass is shown in FIG. 9.

Figure 10:
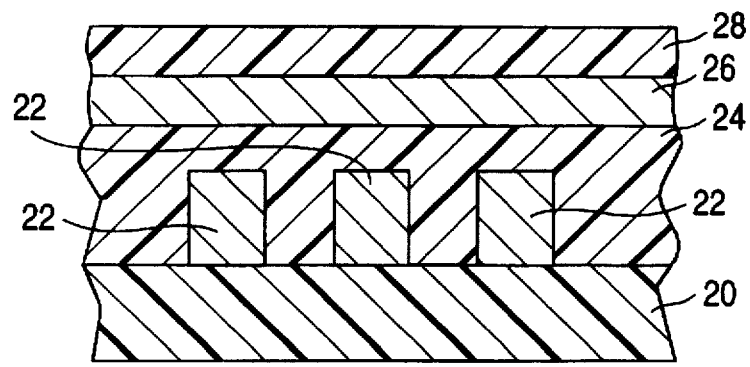
FIG. 10 is a sectional view, similar to the view depicted in FIG. 9, after the step of forming a photoresist layer.
Figure 11:
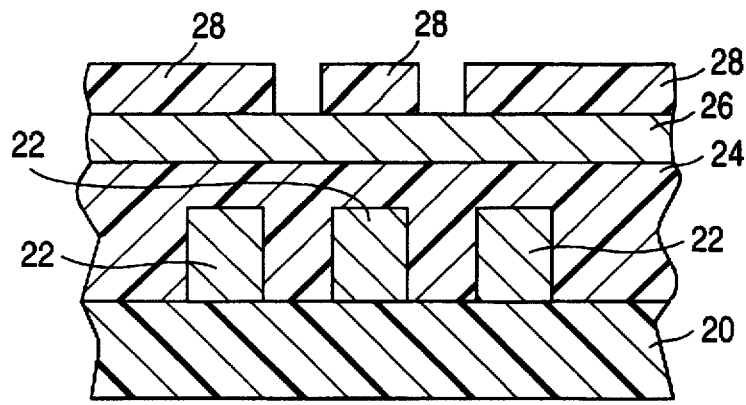
FIG. 11 is a sectional view, similar to FIG. 10, after the step of development of the photoresist layer.
Figure 12:
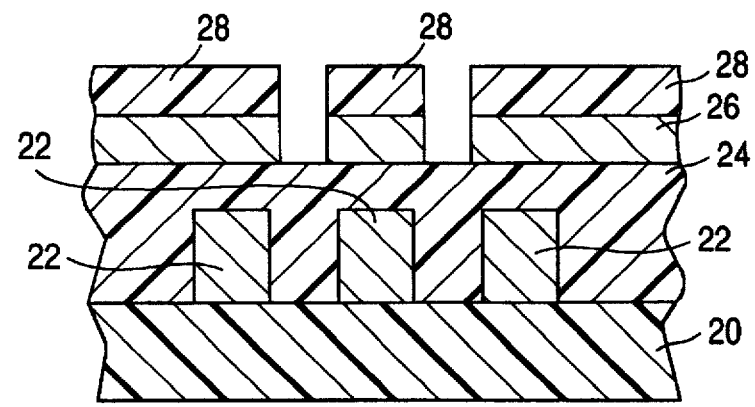
FIG. 12 is a sectional view, similar to FIG. 11, after the step of etching of the transfer layer.

The next step is the forming of the photoresist layer or imaging layer. The composition of the photoresist, and the steps of forming the photoresist film, are conventional, as described above in connection with the photoresist film shown in FIG. 4. The structure resulting from the application of the photoresist layer is shown in FIG. 10. Photoresist layer 28 is shown on conductive transfer layer 26.

The next step is the exposure of the photoresist layer in accordance with conventional techniques. It is contemplated that the photoresist layer will be exposed by electron beam or ion beam methods. Charge will not accumulate in the resist, since charge will be transported and dispersed to the underlying electrically-conductive transfer layer. Exposure accuracy in this case will be high due to the reduction in charging. The exposed photoresist is then developed in accordance with conventional techniques. After the step of development of the photoresist layer 28, the structure shown in FIG. 11 results. Selected portions of the photoresist layer 28 have been removed.

The next step is the etching of the transfer layer. The etching of the transfer layer is accomplished in accordance with conventional techniques for etching spin-on-glass layers. The result of this step is the structure shown in FIG. 12. As may be seen in FIG. 12, selected portions of the transfer layer 26, which selected portions are directly beneath the removed selected portions of the photoresist layer, have been removed.

Figure 13:
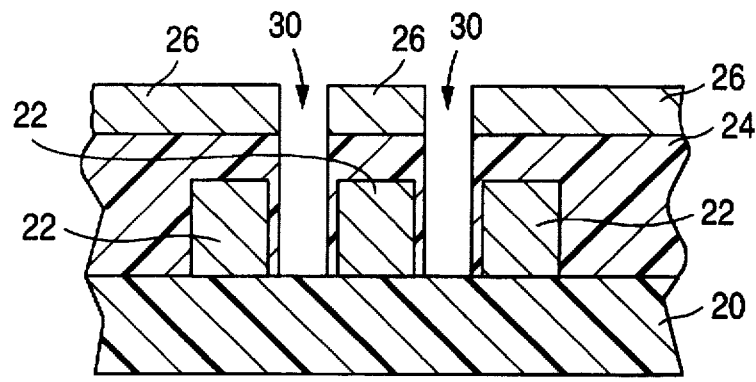
FIG. 13 is a sectional view, similar to FIG. 12, after the step of etching of the planarizing layer.

The next step is the etching of the planarizing layer. The etching of the planarizing layer is carried out in accordance with oxygen reactive ion etching techniques, as is conventional. As the spin-on-glass transfer layer is etchresistant to oxygen, it acts as a mask. The result of the step of etching is the formation of high-aspect ratio channels 30 in the planarizing layer 24, as shown in FIG. 13. The oxygen reactive ion etching step, in addition to etching channels or holes 30 in the planarizing layer 24, simultaneously removes the patterning resist 28 left after the development process. Consequently, in FIG. 13, the photoresist 28 has been removed.

Figure 14:
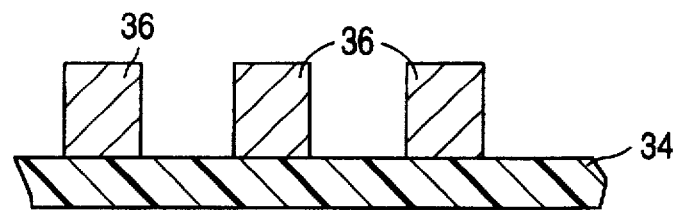
FIG. 14 is a sectional view of the surface of a wafer prior to the first step of a process according to an alternative embodiment of the invention.

An alternative embodiment of a method according to the invention will now be described with reference to FIGS. 14 to 21. In this embodiment, an electrically-conductive layer is provided by applying a liquid to form a distinct electrically-conductive layer in addition to a planarizing layer, a transfer layer, and an imaging layer. In FIG. 14, there is depicted a portion of the wafer 34 having structures 36 thereon. Structures 36 provide an uneven topography.

Figure 15:
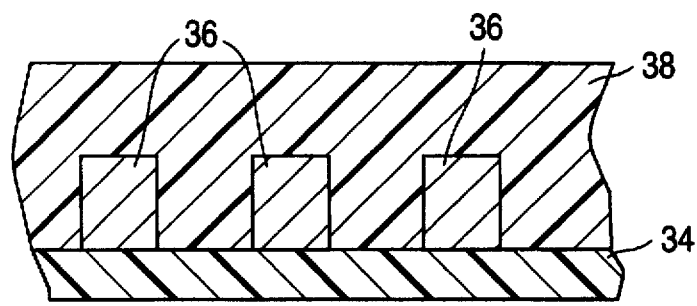
FIG. 15 is a sectional view, similar to the view depicted in FIG. 14, after the step of forming of a planarizing layer.

In the first step of the method, a planarizing layer is formed on the wafer 34 so as to completely cover structures 36. Planarizing layer 38, shown in FIG. 15, may be applied by spin-coating in accordance with conventional techniques, as discussed above. An appropriate substance in a solvent is applied in droplet or liquid-stream form onto a spinning wafer. After application, the substance may be dried, in accordance with conventional techniques, so as to provide planarizing layer 38 on wafer 34 as shown in FIG. 15.

Figure 16:
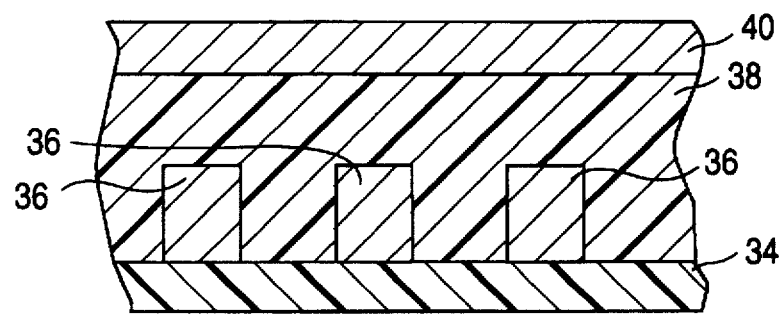
FIG. 16 is a sectional view, similar to the view depicted in FIG. 15, after the step of forming of a conductive polymer layer.

In the succeeding step, referring to FIG. 16, an electrically-conductive polymer 40 is applied on the planarizing layer. Numerous types of electrically-conductive polymers are known. Known conductive polymers include polyacetylene, polyaniline, polypyrrole, polythiophene, poly(phenylenesulfide), and poly(phenylene). Soluble forms of polyacetylenes are known. It can be anticipated that soluble forms of other conductive polymers, with the addition of appropriate functional units to the polymer, can be generated in the future. Referring to FIG. 16, an appropriate conductive polymer 40 is applied through substantially conventional spinning techniques. The electrically-conductive polymer is transported in the form of a liquid which does not attack the planarizing layer. Alternatively, one can bake or passivate the surface with a fluorinated plasma prior to the application of the conductive polymer. Selection of an appropriate solvent is well within the level of skill in the art. The liquid is applied to the spinning wafer in accordance with the techniques discussed above. After application of the liquid, the liquid is allowed to dry, either at room temperature or at elevated temperatures. An electrically-conductive polymer layer 40, as shown in FIG. 16, is thus formed on the planarizing layer 38.

Figure 17:
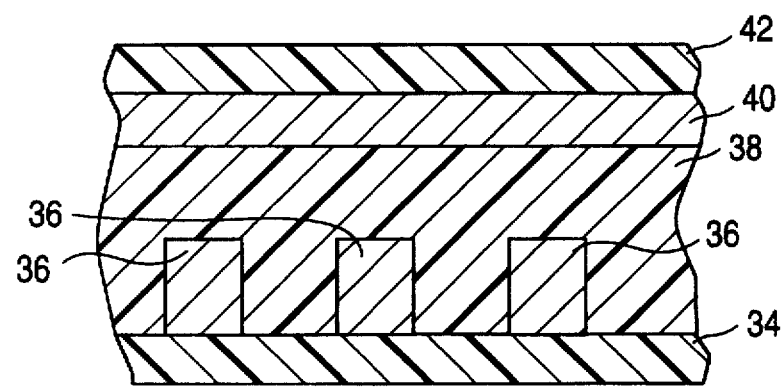
FIG. 17 is a sectional view, similar to the view depicted in FIG. 16, after the step of forming of a spin-on-glass transfer layer.

The next step is the forming on the conductive polymer layer 40 of a non-conductive spin-on-glass transfer layer. The forming of this transfer layer is accomplished by spinning a liquid containing a spin-on-glass in a solvent and allowing the liquid to dry, thereby leaving a spin-on-glass transfer layer 42, as shown in FIG. 17, on conductive polymer layer 40. The details of the spinning and the drying steps are conventional and are discussed above in connection with the spinning and drying steps of the embodiment of FIG. 1. The thickness of the transfer layer 42 is preferably in the range of 500 to 2000 angstroms.

Figure 18:
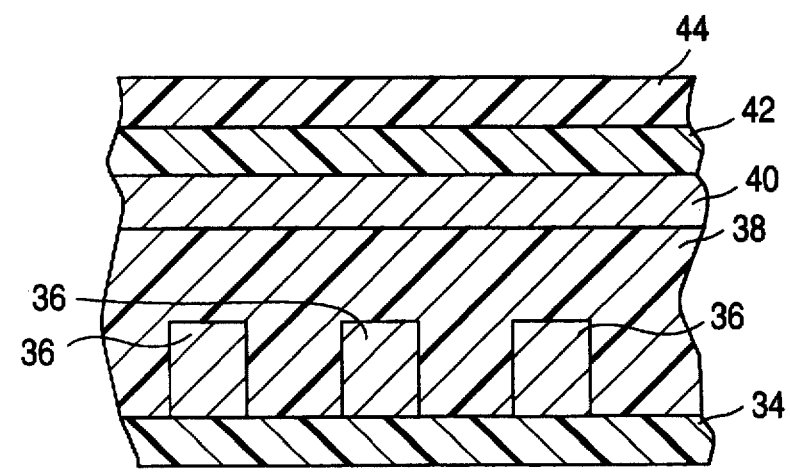
FIG. 18 is a sectional view, similar to the view depicted in FIG. 17, after forming of a photoresist layer.
Figure 19:
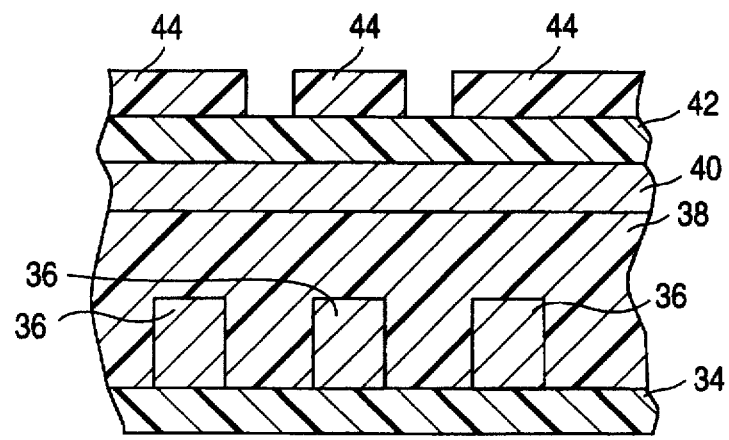
FIG. 19 is a sectional view, similar to the view depicted in FIG. 20, after the step of development of the photoresist layer.

After the step of forming the non-conductive spin-on-glass transfer layer, a photoresist or imaging layer is formed on the transfer layer. The photoresist is applied to the transfer layer by conventional spinning and drying techniques. With reference to FIG. 18, there is shown the structure resulting after the forming of the photoresist layer 44 on the transfer layer 42.

After forming of the photoresist layer 44, the next step is the exposure of the photoresist. Selected areas of the photoresist are exposed in accordance with conventional techniques. It is contemplated that, in connection with the method of the invention, exposure will be by use of charged particles. For example, electron beam direct-write exposure techniques or ion beam exposure techniques may be used. When exposure is conducted with the use of charged particles, there will be a tendency for charge to build up in the exposed areas of the resist. In accordance with the invention, the nonconductive transfer layer 42 is sufficiently thin such that charge will tend to flow across the transfer layer 42. One of ordinary skill in the art will be able to select the thickness of layer 42 based on such parameters as writing time. The resistivity in layer 40 will range from $10^{-4}$ ohm-cm to $10^{-1}$ ohm-cm. When charge reaches the conductive polymer layer 40, charge will be dispersed in the electrically-conductive polymer layer 40. As a result, the build-up of charge in exposed areas of the resist will be minimized.

After the step of exposure, the step of development of the photoresist 44 is performed and conducted in accordance with conventional techniques for this type of photoresist. Thus, selected areas of the photoresist 44 are removed, resulting in the structure shown in FIG. 19.

Figure 20:
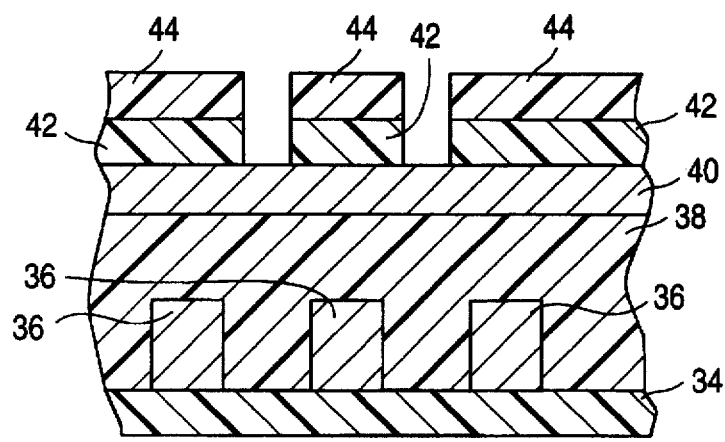
FIG. 20 is a sectional view, similar to the view depicted in FIG. 19, after the step of etching of the transfer layer.

Subsequent to the step of developing the photoresist, the next step is etching of the transfer layer 42. This step of etching is carried out in accordance with conventional techniques for etching of spin-on-glass transfer layers. For example, a plasma of $CHF_3$ and $O_2$ can be used in proportion of approximately 5 to 1 at a 60 millitorr pressure. As a result of the step of etching, as shown in FIG. 20, the areas of the transfer layer 42 left exposed by removal of selected portions of the photoresist 44 are removed.

Figure 21:
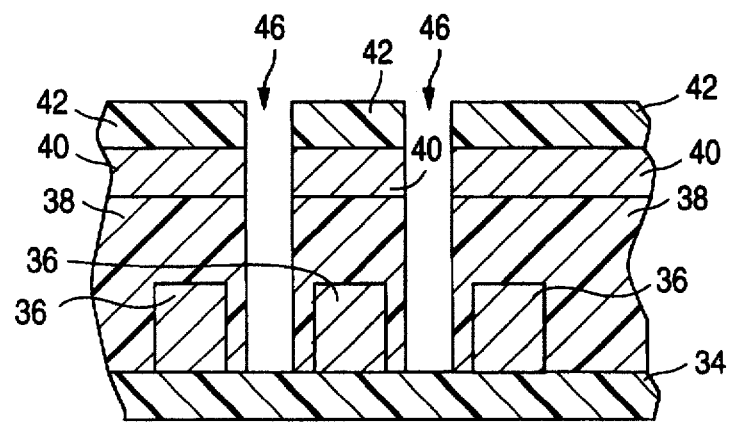
FIG. 21 is a sectional view, similar to the view depicted in FIG. 20, after the step of etching of the planarizing layer.

After the step of etching the transfer layer, the next step is etching of the conductive polymer layer 40 and the planarization layer 38. This step of etching may be carried out, as is conventional, by oxygen reactive ion etching methods. A wet etch could also be employed in carrying out this step. The etchant also tends to remove the photoresist that was used to pattern the transfer layer 42. The structure shown in FIG. 21 is the result of the step of etching the planarizing layer. Channels or holes 46 are formed through conductive polymer layer 40 and planarizing layer 38 where the conductive polymer layer 40 was left exposed by removal of selected portions of the spin-on-glass transfer layer 42. The photoresist 44 has been removed by the oxygen etchant during the channel formation. The spin-on-glass layer 42, which is resistant to the oxygen reactive ion etching process, remains.

Figure 22:
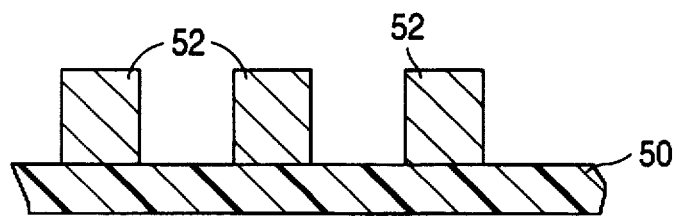
FIG. 22 is a sectional view of a partially-processed semiconductor wafer prior to the first step of a process according to an alternative embodiment of the invention.
Figure 23:
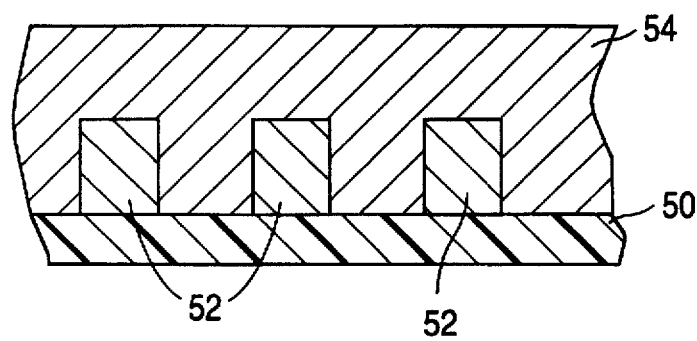
FIG. 23 is a sectional view, similar to the view depicted in FIG. 22, after the step of forming of a conductive planarizing layer.

Another alternative embodiment of a method of the invention will now be described with reference to FIGS. 22 through 28. In this embodiment, the step of forming an electrically-conductive layer includes the step of applying a liquid to the substrate to form an electrically-conductive planarizing layer. With reference to FIG. 22, there is shown a wafer 50 and representative structures 52 formed thereon.

forming an uneven topography. According to this embodiment of the invention, a electrically-conductive planarizing layer is now formed on wafer 50. Electrically-conductive planarizing layer 54 is shown in FIG. 23. Electrically-conductive planarizing layer 54 is formed by conventional techniques involving the spinning of a liquid containing an appropriate resin and solvent, and the drying of the solvent from the liquid after the step of spinning. The electrically-conductive planarizing layer may be any one of a number of electrically-conductive polymers. Such electrically-conductive polymers may include polyacetylene, polyaniline, polypyrrole, polythiophene, poly(phenylenesulfide) and poly(phenylenevinylene). As noted above, soluble forms of polyacetylenes are known. It can be anticipated that soluble forms of other conductive polymers, with the addition of appropriate functional units to the polymer, will be developed in the future. Conductive planarizing layer 54 is preferably about 2 microns thick.

Figure 24:
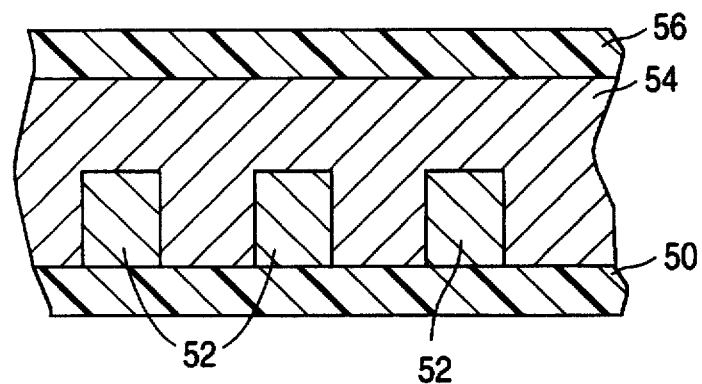
FIG. 24 is a sectional view, similar to the view depicted in FIG. 23, after the step of forming of a transfer layer.

After the step of forming the electrically-conductive planarizing layer, there is formed a conventional transfer layer on the planarizing layer. The transfer layer may be, as is conventional, a spin-on-glass. The spin-on-glass layer is formed by applying a liquid in droplet or stream form, the liquid containing a solvent and polysiloxane resin or silicate glass precursor or other appropriate material, to a spinning wafer, allowing a layer to form, and then drying the layer. Thus, as shown in FIG. 24, there is formed a transfer layer 56 on the planarizing layer 54. This transfer layer is electrically insulating. The transfer layer 56 is desirably thin so as to allow a small amount of charge to travel through the transfer layer as will be explained below. For example, the thickness of the transfer layer 56 may be in the range of 500 to 2000 angstroms.

Figure 25:
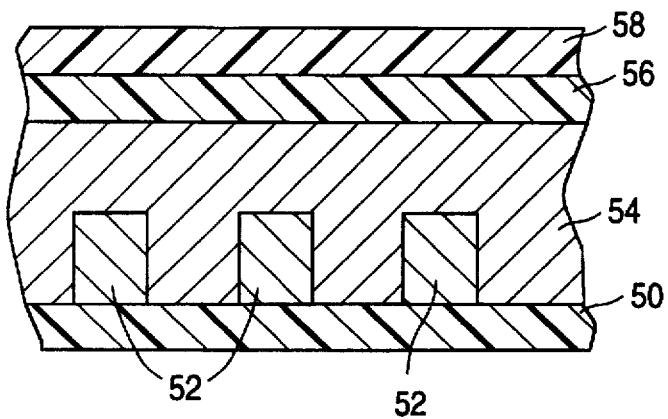
FIG. 25 is a sectional view, similar to the view depicted in FIG. 24, after formation of the photoresist layer.

The next step is the forming of a photoresist or imageable layer on the transfer layer. As is conventional, the photoresist layer is formed by spinning techniques. Thus, as shown in FIG. 25, the photoresist layer 58 is formed on transfer layer 56.

The next step is the exposure of the photoresist layer 58. The step of exposure involves either electron-beam direct writing techniques or ion beam exposure techniques. Both of these techniques are conventional in the art. In both of these techniques, there is a tendency for charge to build up in the photoresist layer. Because the transfer layer 56 is thin, charge travels from the photoresist 58 across the transfer layer to the planarizing layer. Because the planarizing layer 54 is conductive, charge will be dispersed in the planarizing layer. Accordingly, there will not be a build-up of charge in the composite layer that would tend to deflect the electron beam or ion beam.

Figure 26:
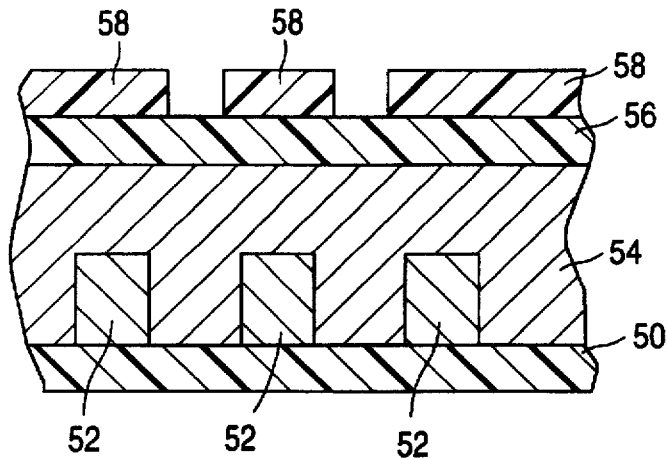
FIG. 26 is a sectional view, similar to the view depicted in FIG. 25, after the step of developing of the photoresist layer.
Figure 27:
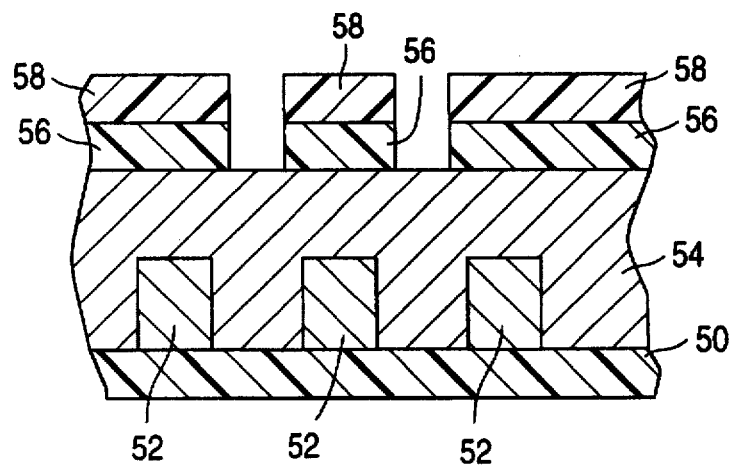
FIG. 27 is a sectional view, similar to the view depicted in FIG. 26, after the step of etching of the transfer layer.

After the step of exposure, the photoresist layer is developed in accordance with conventional techniques. As shown in FIG. 26, selected portions of the photoresist layer 58 have been removed by the step of developing. After the step of developing, the transfer layer 56 is etched. The step of etching is carried out in accordance with conventional techniques for etching a spin-on-glass transfer layer. In the illustrated embodiment, the remaining photoresist layer is etch-resistant. However, the resist could also be removed during the step of etching. The result of the step of etching the transfer layer 56 is shown in FIG. 27. Selected portions of transfer layer 56, beneath removed portions of resist layer 58, have been removed.

Figure 28:
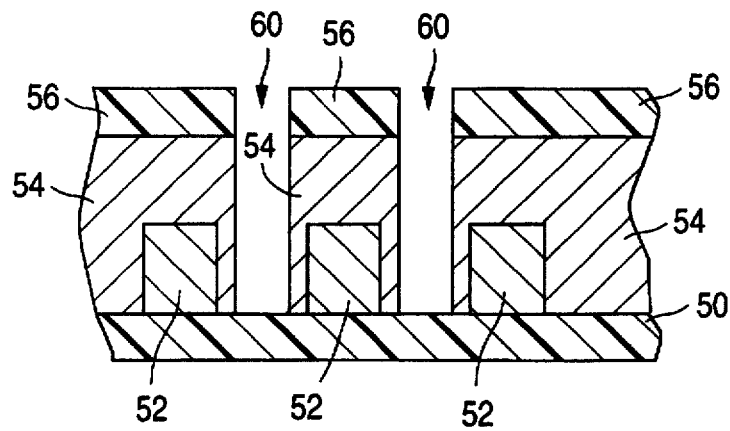
FIG. 28 is a sectional view, similar to the view depicted in FIG. 27, after the step of etching of the conductive planarizing layer.

After the step of etching the transfer layer, the next step is the step of etching the planarizing layer. The step of etching the planarizing layer may be carried out by a conventional oxygen reactive ion etching process. The use of an oxygen reactive ion etching process also removes the remaining photoresist 58. Accordingly, as seen in FIG. 28, channels or holes 60 are formed in planarizing layer 54 as a result of the step of etching the planarizing layer. As may be seen in FIG. 28, the photoresist 58 is also removed during the step of etching. The transfer layer 56 is etch resistant to, for example, a straight oxygen etch, and thus serves as an etch mask.

Figure 29:
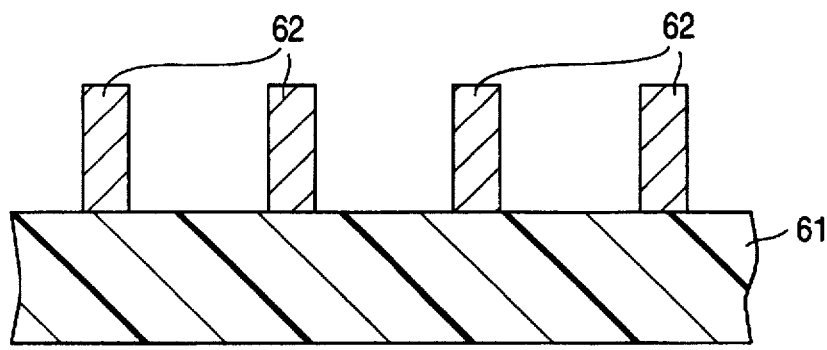
FIG. 29 is a sectional view of the surface of a wafer prior to the first step according to an alternative embodiment of the invention.

An alternative embodiment of the invention will now be described with reference to FIGS. 29 to 35. In this embodiment, an electrically-conductive layer is provided by applying a liquid to form an electrically-conductive imageable layer or electrically-conductive photoresist. In FIG. 29, there is depicted a portion of a wafer 61 having structures 62 thereon. Structures 62 provide an uneven topography.

Figure 30:
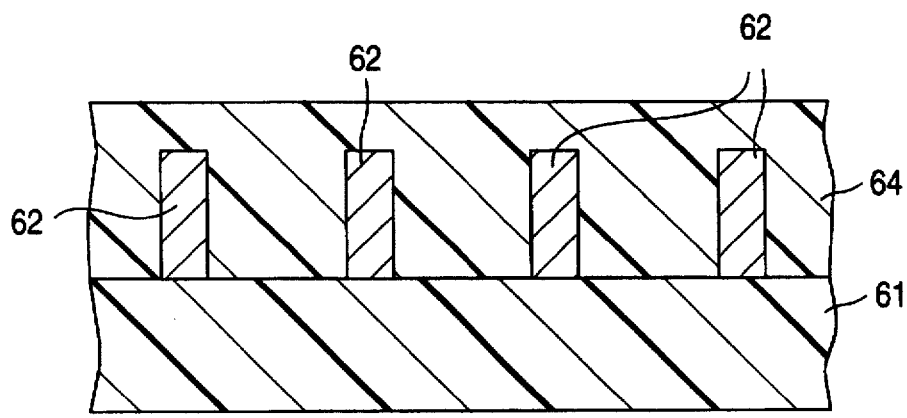
FIG. 30 is a sectional view, similar to FIG. 29, after the step of forming a planarizing layer.
Figure 31:
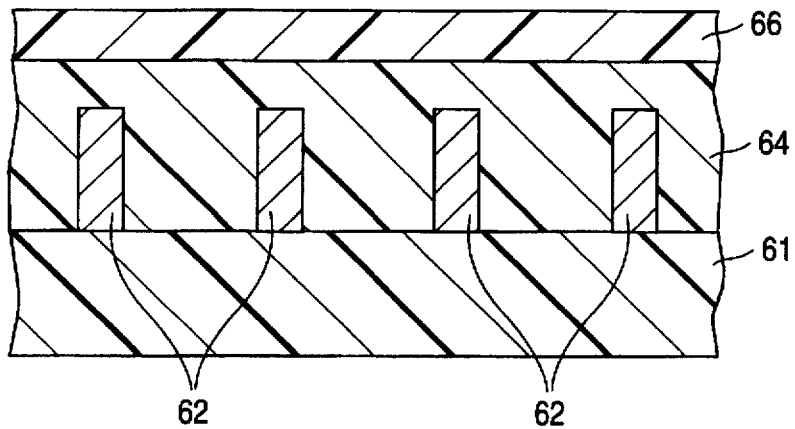
FIG. 31 is a sectional view, similar to FIG. 30, after the step of forming a transfer layer.

A planarizing layer 64, shown in FIG. 30, is now applied. This planarizing layer may be of conventional composition and is applied in accordance with conventional techniques as explained above in accordance with the embodiment described above and illustrated in FIGS. 14-21 above. A transfer layer 66, shown in FIG. 31, is now applied. This transfer layer may be of conventional composition and is applied in accordance with conventional techniques as explained above in accordance with the embodiment described above and illustrated in FIGS. 14-21.

Figure 32:
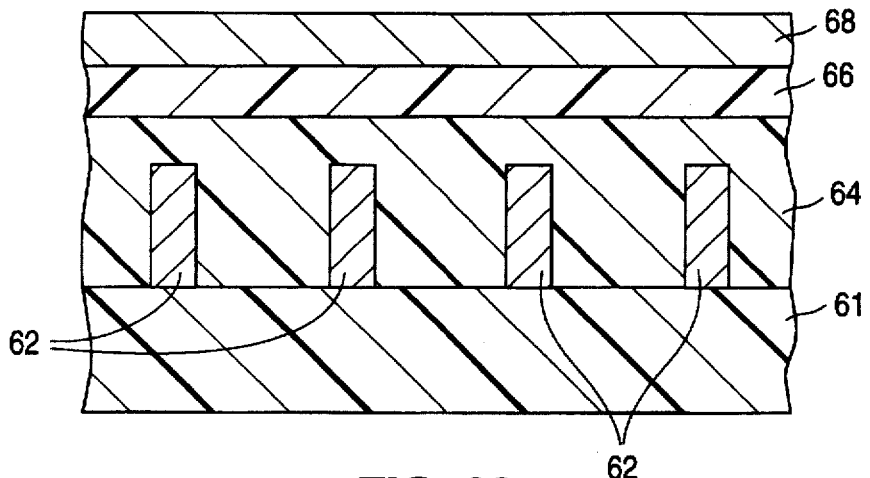
FIG. 32 is a sectional view, similar to FIG. 31, after the step of forming of an electrically-conductive imaging layer.
Figure 33:
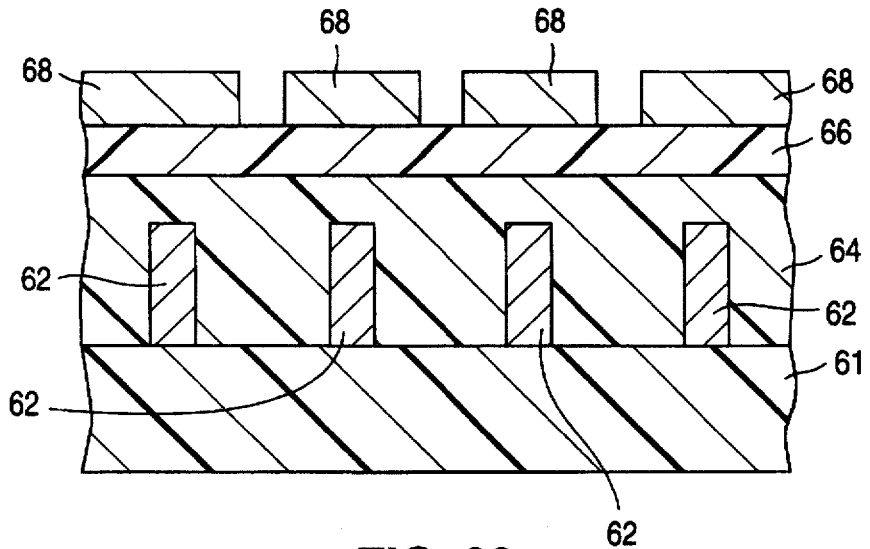
FIG. 33 is a sectional view, similar to FIG. 32, after the step of development of the imaging layer.

With reference to FIG. 32, an electrically-conductive imaging layer 68, or conductive photoresist, is now applied by spinning an appropriate substance on the transfer layer 66. The electrically-conductive imaging layer 68 is then exposed in accordance with conventional techniques. It is contemplated that the imaging layer will be exposed by electron beam or ion-beam techniques. Charge will not accumulate locally in the imaging layer, but will be dispersed throughout the imaging layer. Exposure accuracy will thus be high. The exposed imaging layer 68 is then developed in accordance with conventional techniques. Selected areas of the imaging layer 68 are removed, resulting in the structure shown in FIG. 33.

Figure 34:
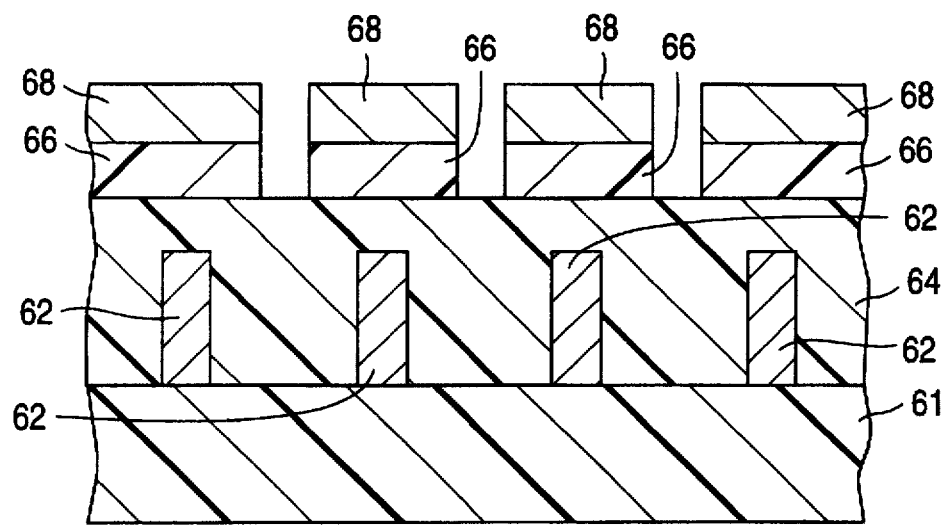
FIG. 34 is a sectional view, similar to FIG. 33, after the step of etching of the transfer layer.

Subsequent to the step of developing the imaging layer, the next step is etching of the transfer layer 66. This step of etching is carried out in accordance with conventional techniques. As a result of the step of etching, as shown in FIG. 34, the areas of transfer resist 66 left exposed by removal of selected portions of the imaging layer 68 are removed.

Figure 35:
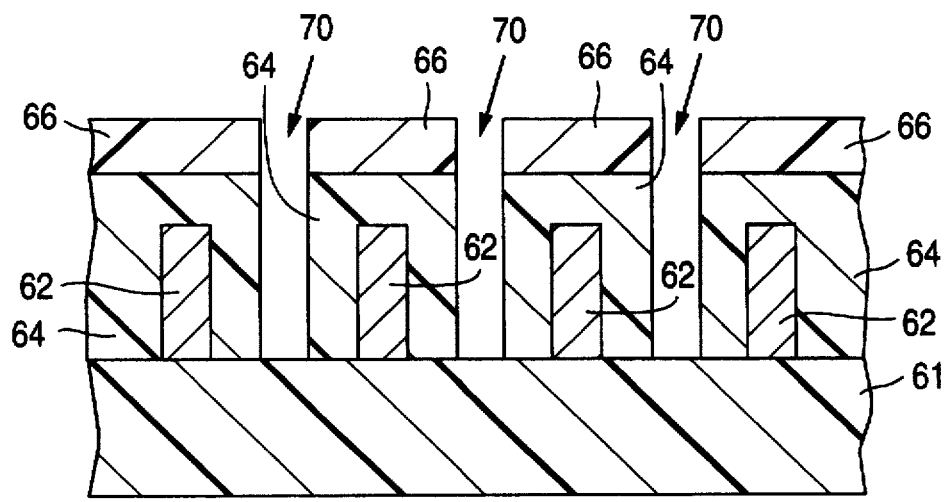
FIG. 35 is a sectional view, similar to FIG. 34 after the step of etching of the planarizing layer.

The next step after etching the transfer layer 66 is etching the planarization layer 64. This step of etching may be carried out by one of a number of conventional techniques. The structure shown in FIG. 35 is the result of the step of etching the planarizing layer 64. Channels or holes 70 are formed through planarizing layer 64 where the planarizing layer was left exposed by removal of selected portions of the transfer layer. The remaining imaging layer has been removed by the step of etching the planarizing layer.

Figure 36:
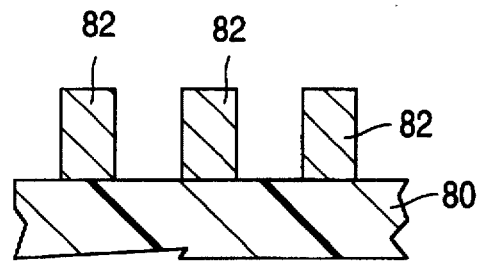
FIG. 36 is a sectional view of the surface of a wafer prior to the first step according to an alternative embodiment of the invention.
Figure 37:
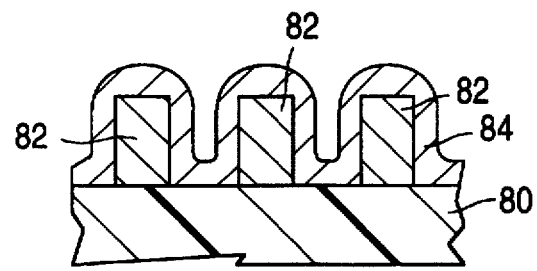
FIG. 37 is a sectional view, similar to FIG. 36, after the step of forming of an electrically-conductive imaging layer.
Figure 38:
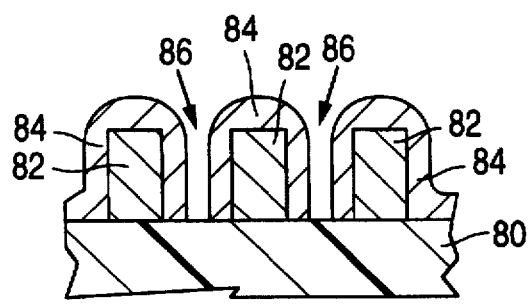
FIG. 38 is a sectional view, similar to FIG. 37, after the step of developing of the electrically-conductive imaging layer.

With reference to FIGS. 36 to 38, an alternative embodiment of the invention in which a single layer is applied on a substrate will be described. In FIG. 36, there is depicted a portion of a wafer 80 having structures 82 thereon. Structures 82 provide an uneven topography.

Referring to FIG. 37, a conductive imageable layer 84 has been applied. This conductive imageable layer is applied by spinning a liquid and allowing the liquid to dry to form a solid layer, as explained above. The conductive imageable layer 84 is conformal over large features having large intervening spaces, and large periodicities, and planarizes smaller features, small intervening spaces, and smaller periodicities. Such smaller features are approximately 1 to 10 microns in size, with equal spacings between features. In the example shown in FIGS. 36 to 38, the lines and spaces are on the order of 10 microns or greater, so that the imageable layer 84 is conformal. If the periodicities were smaller, a planarizing effect would be achieved.

The imaging layer 84 is then exposed by electron-beam or ion beam techniques. Charge will not accumulate locally in the imaging layer 84 but will be dispersed throughout the imaging layer. However, because there are variations in the thickness of imaging layer 84, exposure accuracy will not be as high as is achieved when a planarizing layer is applied before forming of the imageable layer.

After exposure, imaging layer 84 is developed in accordance with conventional techniques. Referring to FIG. 38, it will be seen that selected portions of the substrate 80 are now exposed by developing of imaging layer 84.

Referring to FIGS. 39–43, there will now be described an alternative embodiment of the invention employing a two layer process. Referring to FIG. 39, there is depicted a portion of a wafer 90 having structures 92 thereon. Structures 92 provide an uneven topography.

Referring to FIG. 40, a planarizing layer 94 is now applied. Planarizing layer 94 is a non-photoactive, electrically-conductive, thick planarizing layer. As discussed above, such an electrically-conductive planarizing layer may be made of any one of a number of conductive polymers. Planarizing layer 94 is formed, as noted above, by a spin process.

Referring to FIG. 41, a resist or imageable layer 96 is now applied. The resist 96 is a substance that is resistant to an etch for the planarizing layer. The resist 96 is then exposed by electron-beam or ion-beam lithography. As planarizing layer 94 is electrically-conductive, charge will not accumulate locally in the resist 96 during exposure, but will be dispersed in planarizing layer 94. The resist 96 is then developed. In FIG. 42, selected areas of resist 96 have been removed as a result of exposure and developing.

The planarizing layer 94 is now etched. The remaining portions of resist 96 act as an etch mask. Referring to FIG. 43, after the step of etching, there are formed in planarizing layer 94 holes or channels 98.

It will be understood from the foregoing that a conductive layer may be spun on at any stage prior to exposure, so long as charge will tend not to accumulate in the resist. Thus, as explained above, a conductive planarizing layer, a conductive transfer layer, a conductive imaging layer, or a distinct conductive layer having no other function, may be spun on a substrate.

Figure 44:
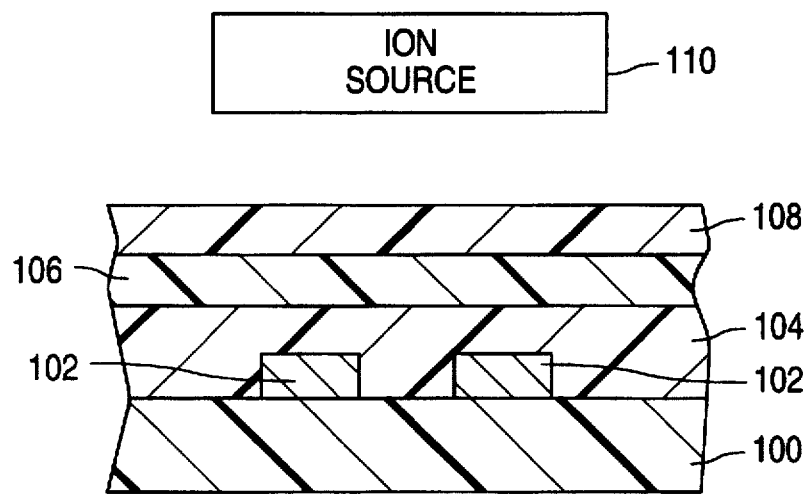
FIG. 44 is a sectional view of a wafer surface during a step of a method according to an alternative embodiment of the invention.
Figure 45:
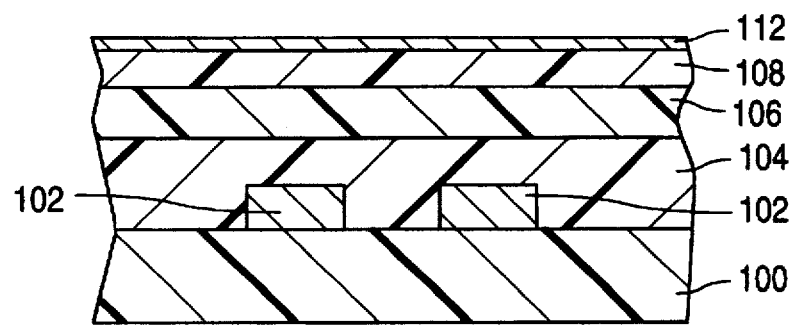
FIG. 45 is a sectional view, similar to FIG. 44, after completion of the method according to the embodiment of FIG. 44.

With reference to FIGS. 44 and 45, there will now be explained an embodiment of the invention in which a conductive layer is formed by ion bombardment. FIG. 44 depicts in section a portion of a wafer 100 having thereon structures or feature 102, a conventional planarizing layer 104 completely covering the structures 102, a conventional transfer layer 106 formed on planarizing layer 104, and an imaging layer 108, comprising a resist for charged-particle lithography, formed on transfer layer 106. Ion source 110 emits a beam of charged particles onto the surface of imaging layer 108. The ion source 110 may provide, for example, an argon ion beam. The ion beam should be of low voltage, that is, sufficient only to cause ions to penetrate a relatively short distance into the imaging layer. The energy of the ion beam is preferably in the range of a few hundred volts. The specific ion beam energy will depend on the type of plasma processor employed, and is well within the capacity of one skilled in the art. By contrast, charged particle beams used for exposure have energies in the range of hundreds of kilovolts.

After bombardment for a desired time, a thin carbonized layer 112 is formed on the surface of the bombarded layer 108, as shown in FIG. 45. The carbonized layer 112 is electrically conductive. Exposure of the imaging layer 108 by conventional charged-particle lithographic techniques, such as electron-beam direct write, may be carried out. There will be little or no loss of resolution as a result of the forming of carbonized layer 112. The carbonized layer 112 will dissipate charge during exposure, thereby avoiding the build-up of charge in the resist.

It will be understood that any layer in a multiplelayer resist may be bombarded with low-energy ions to form an electrically-conductive carbonized layer. For example, a planarizing layer in a trilevel resist may be bombarded with low-energy ions to form a carbonized layer, prior to forming of a transfer layer on the planarizing layer. Alternatively, a transfer layer in a trilevel resist may be bombarded with low-energy ions to form a carbonized, electrically-conductive layer, prior to forming of an imageable layer on the transfer layer.

It will be appreciated that there are considerable variations that can be accomplished in a method or composition of the invention without departing from its scope. As a result, although preferred embodiments of a method and composition of the invention has been described above, it is emphasized that the invention is not limited to a preferred embodiment and there exist other alternative embodiments that are fully encompassed within the invention's scope, which is intended to be limited only by the scope of the appended claims.

What is claimed is:

1. In a process for performing charged-particle lithography employing a trilevel resist having a planarizing layer, a transfer layer and an active resist, the improvement comprising the step of spinning an electrically-conductive transfer layer on the planarizing layer, wherein said conductive transfer layer comprises a silioxane resin and a conductive dopant, and wherein said conductive dopant comprises a metal soap.

2. The improvement of claim 1, wherein said metal soap comprises a metal oleate.

3. The improvement of claim 2, wherein said metal olete is selected fro the group consisting of cobalt oleate, zinc oleate, zirconium oleate and titanium oleate.

* * * * *

UNITED STATES PATENT AND TRADEMARK OFFICE
CERTIFICATE OF CORRECTION

PATENT NO.: 5,783,363
DATED: July 21, 1998
INVENTOR(S): Michael E. Thomas

It is certified that errors appear in the above-identified patent and that said Letters Patent is hereby corrected as shown below:

In Col. 12, line 56, delete "olete" and replace with --oleate--.

In Col. 12, line 57, delete "fro" and replace with --from--.

Signed and Sealed this

Twentieth Day of October, 1998

Attest:

BRUCE LEHMAN

Attesting Officer

Commissioner of Patents and Trademarks